United States Patent [19]

Sirsi

[11] 4,283,236
[45] Aug. 11, 1981

[54] METHOD OF FABRICATING LATERAL PNP TRANSISTORS UTILIZING SELECTIVE DIFFUSION AND COUNTER DOPING

[75] Inventor: Ramesh M. Sirsi, Indialantic, Fla.

[73] Assignee: Harris Corporation, Melbourne, Fla.

[21] Appl. No.: 77,234

[22] Filed: Sep. 19, 1979

[51] Int. Cl.³ .................... H01L 21/22; H01L 21/31
[52] U.S. Cl. .................................. 148/187; 29/578;
  148/1.5; 148/175; 357/35; 357/44; 357/89;
  357/92
[58] Field of Search ............... 148/1.5, 175, 187;
  29/578; 357/34, 35, 44, 46, 89, 91, 92

[56] References Cited

U.S. PATENT DOCUMENTS

| 3,766,446 | 10/1973 | Tarui et al. | 357/35 |
| 3,873,989 | 3/1975 | Schinella et al. | 357/35 |
| 4,053,923 | 10/1977 | Kang | 357/46 X |
| 4,072,981 | 2/1978 | Black et al. | 357/89 X |
| 4,126,496 | 11/1978 | Verderber | 148/187 |
| 4,155,777 | 5/1979 | Dunkley et al. | 148/1.5 |
| 4,160,988 | 7/1979 | Russell | 357/35 X |
| 4,180,827 | 12/1979 | Gates | 357/44 |
| 4,196,228 | 4/1980 | Priel et al. | 148/1.5 X |

Primary Examiner—L. Dewayne Rutledge
Assistant Examiner—W. G. Saba
Attorney, Agent, or Firm—Leitner, Palan, Martin & Bernstein

[57] ABSTRACT

A lateral PNP transistor is formed by diffusing N type inpurities into an N type layer to form base contact region and base region, diffusing P type impurities into the N base region and N layer to form emitter and collector regions respectively, and counter doping the layer area between the N base region and the collector region. The counter doping is performed through a non-critical mask aperture extending between the emitter and collector regions.

11 Claims, 8 Drawing Figures

4,283,236

METHOD OF FABRICATING LATERAL PNP TRANSISTORS UTILIZING SELECTIVE DIFFUSION AND COUNTER DOPING

BACKGROUND OF THE INVENTION

The present invention relates generally to lateral bipolar transistors and more specifically to an improved double diffused PNP lateral bipolar transistor.

Conventional lateral PNP bipolar transistors are generally fabricated by simultaneously diffusing P type collector and emitter regions side by side in an N epitaxial base region during the P base diffusion cycle of the vertical NPN transistors. This structure is illustrated in FIG. 1. The main problems in achieving high performance lateral PNP transistors using this scheme are that the distance between the emitter and collector regions cannot be reduced anymore than the limits of the photolithographic process. Thus, there is a technological limitation to the minimum base which is achievable by this method. This limitation correctly influences the performance characters of the device. Another difficulty is that the N⁻ region which is common to the PNP and NPN devices cannot be independently optimized. Further the uniformity of the N⁻ epitaxial base region does not contribute to enhancing carrier transport across the base region.

To improve the charcateristics of the lateral PNP transistor, a double-diffused technique was developed. This technique basically involved diffusing N type impurities through an aperture into a P epitaxial region to form the base region and subsequently diffusing P type impurities through the same aperture to form the emitter region. Thus, the base width would be the difference between the P emitter diffusion and the N base diffusion. The resulting structure is specifically shown in FIG. 2. This technique is specifically described in U.S. Pat. No. 3,766,446 for an NPN lateral transistor. A doubly-diffused lateral PNP transistor not using this same aperture but achieving the same results is illustrated in U.S. Pat. No. 3,873,989.

The prior art structure of FIG. 2 although reducing the base width, results in a structure which is incompatible with the formation of other elements in an integrated circuit. This results because of the use of the P⁻ epitaxial region which prevents readable formation of vertical NPN devices. Similarly, it should be noted that the P⁻ epitaxial region which forms the bulk collector between the P⁺ collector contact region and the N base region contributes to the series collector resistance which in turn influences both the frequency response and saturation voltage for the bipolar transistor.

Thus, there exists a need for a method of fabricating a lateral PNP transistor which is compatible with the formation of other devices in an integrated circuit as well as providing improved frequency response and voltage saturation.

SUMMARY OF THE INVENTION

An object of the present invention is to provide a method of fabricating PNP lateral transistors in an N epitaxial layer so as to make the device formation compatible with other elements in an integrated circuit.

A further object of the present invention is to provide a method of fabricating a lateral PNP transistor which will enhance a carrier transportation across the base region.

A still further object of the present invention is to provide a fabrication method which allows independent adjustment of frequency response and saturation voltage of a PNP lateral transistor.

An even further object of the present invention is to provide a method of fabricating a PNP bipolar transistor which enhances the emitter injection efficiency.

A still even further object of the present invention is to provide a method of fabricating a PNP lateral transistor wherein the characteristics are substantially independent of the N epitaxial layer in which it is formed.

These and other objects, advantages, and novel features of the present invention are achieved by the following process.

A masked layer is formed on an N epitaxial layer having base contact, emitter, and collector apertures, therein. N type impurities are introduced through the base contact and emitter regions to form a base contact and base regions having a higher impurity concentration than the N epitaxial layer. P type impurities are then introduced through the emitter and collector apertures to form an emitter region in the N base region and a collector region in the N epitaxial layer. The masking material is then removed from between the emitter aperture and the collector aperture. P type impurities are then introduced through the enlarged aperture to counter dope the N epitaxial area between the base region and the collector region sufficiently to convert this area to P conductivity type without converting the N diffused base region. Metal contacts can then be made to the appropriate regions. The masked layer may be formed by preferentially oxidizing the substrate to form thick oxide masking layer and thin oxide regions in the apertures. The impurities may be introduced by ion implantation. By forming the N base region by diffusion into an N epitaxial layer, a graded base structure is produced. The electric field created by the gradient of impurities in the base region enhances the transporation of carriers across the lateral base region and thereby improving frequency performance of the device. The counter doping can be adjusted to individually tailor the frequency response and saturation voltage of the device independent of the epitaxial layer. By using the counter doping step, a non-critical step for this mask may be used since the impurities introduced during the counter doping step will have no effect on the emitter and collector regions except to enhance the emitter efficiency and will have minimal effect on the high impurity diffused base region.

Other objects, advantages and novel features of the present invention will become evident when considered in conjunction with the accompanying drawings.

DESCRIPTION OF THE PREFERRED EMBODIMENTS

Figure 1:
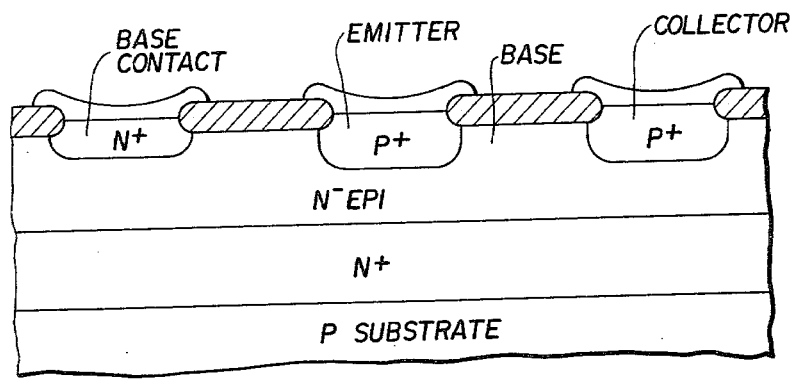
FIG. 1 is a cross-sectional view of PNP lateral transistor of the prior art.
Figure 2:
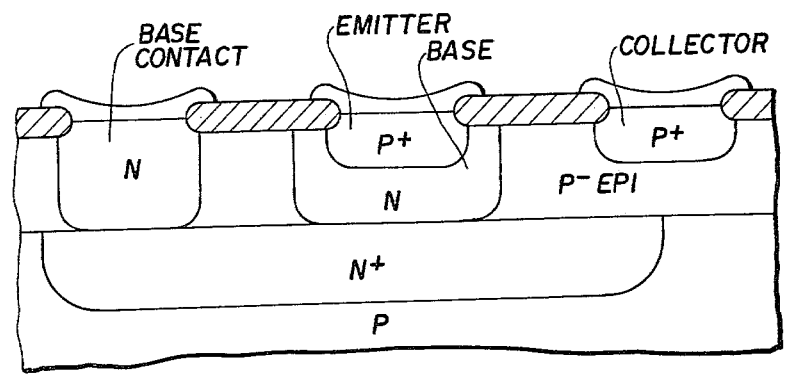
FIG. 2 is a cross-sectional view of another PNP lateral transistor of the prior art.
Figure 3:
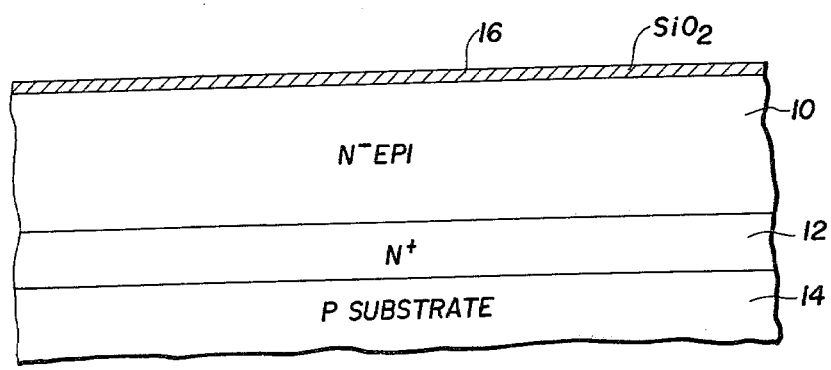
FIGS. 3 through 7 are cross-sectional views of a PNP lateral transistor at various states of fabrication according to the principles of the present invention.
Figure 4:
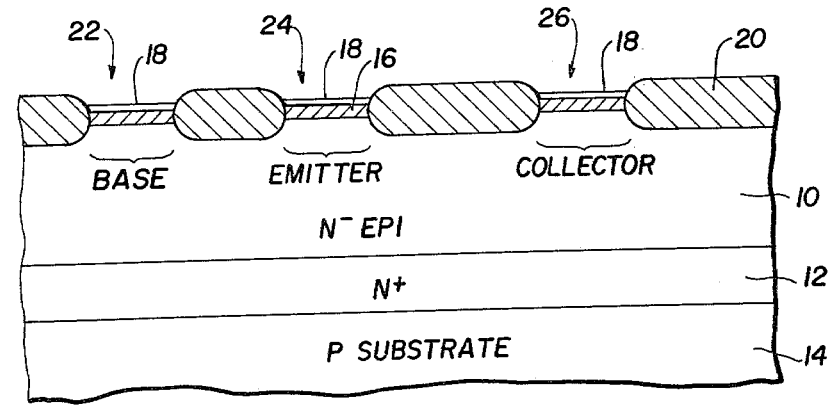

The process of fabrication according the principles of the present invention, as illustrated in FIG. 3, begins with a wafer having an N− epitaxial region 10 of an impurity concentration of $10^{15}$ and a bulk resistance of 5 ohms-centimeters formed on an N+ layer or buried region 12 having a sheet resistance of 15 ohms per square which is formed on a P substrate 14 which has a bulk resistance of 1 to 2 ohm-centimeters. The top surface of the N epitaxial layer 10 is covered by a thin oxide layer 16 of for example 800 angstroms thickness. To form a mask having apertures for the base contact, emitter, and collector regions, the thin oxide layer 16 is covered by an oxidation inhibiting layer, for example silicon nitride, and delineated leaving the silicon nitride layer only over that portion of the oxide layer which are to become the apertures of the mask. The wafer is then oxidized resulting in a thick oxide layer 20 having base contact aperture 22, emitter aperture 24 and collector aperture 26 therein. The resulting structure is illustrated in FIG. 4. The silicon nitride or oxidation inhibiting layer is then removed from the apertures and the wafer is ready for region formation.

Although the masking layer has been described as being formed by the growth of a thick oxide layer and a thin oxide layer, obviously, other methods may be used to form the masking layer. These methods may include forming an initially thick oxide layer and etching to form the apertures. As will be noted hereafter, the preferred method is to introduce impurities by an implantation and, thus, it is desirable to have a thin oxide layer in the apertures in the mask to protect the N epitaxial layer surface. The differential oxidation technique results economically and proficiently in the combined thin and thick oxide layers although the thin oxide regions may be formed after etching a thick oxide region.

Figure 5:
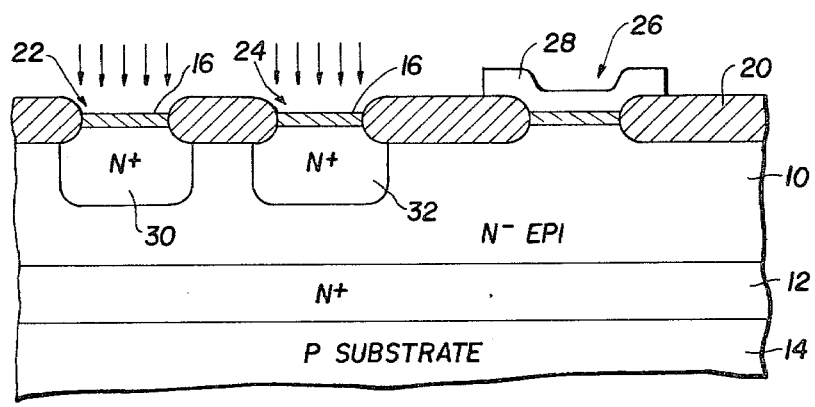

The first impurites to be introuded into the N epitaxial region 10 are N type impurities, for example phosphorous, to produce a base contact and base regions. Since this diffusion is to take place only through base contact aperture 22 and emitter aperture 24, a mask must be formed over the collector aperture 26. This mask is formed by applying a metal layer and delineating the same. The resulting mask 28 is illustrated in FIG. 5. Impurities may be introduced by deposition and diffusion or by ion implantation. The resulting base contact region 30 and base region 32 have an impurity concentration of $10^{17}$ carriers/cm$^3$ and a depth of 2 microns.

Figure 6:
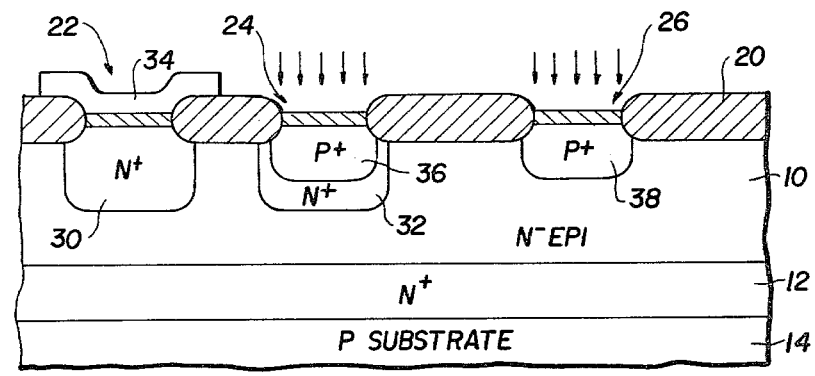

The next impurity introduction is to be through the emitter and collector apertures 24 and 26, respectively to form the emitter and collector regions. Thus, the base contact aperture 22 must be masked. As for the previous impurity introduction step, a layer of metal is applied and delineated to produce a resulting mask 34 in base contact aperture 22, as illustrated in FIG. 6. P type impurities, for example, boron, are introduced through emitter aperture 26 and collector aperture 28 to form emitter region 36 in the base region 32 and collector region 38 in the epitaxial layer 10. The emitter region 36 and collector region 38 have an impurity concentration of $10^{19}$ carriers/cm$^3$ and a depth of approximately 1 to 2 microns. As with the previously impurity introduction step, the impurities may be introduced by deposition and diffusion or preferably by ion implantation and diffusion.

Figure 7:
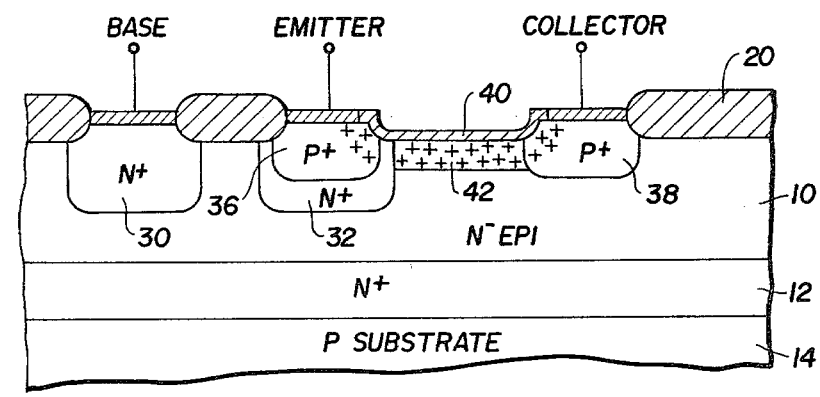

Finally, a portion of the thick oxide layer 20 between the emitter and collector apertures 26 and 28 is etched to form a substantially thin oxide region 40 as illustrated in FIG. 7. The wafer is then subjected to a non-critical or non-selective P type impurities introduction so as to counter dope the area of the N epitaxial region 10 between the collector region 38 and the base region 32. Using ion implantation for example, the dope N level have a dosage of $2.0 \times 10^{11}$ at an implant energy of 60 KeV is sufficient to convert the region of the N epitaxial layer 10 between the collector 38 and the emitter 32 to a P type region 42 having impurity concentration of $10^{16}$ carriers/cm$^3$ and a depth of 0.6 microns. This counter doping step is insufficient to convert the highly doped N+ base contact region 30 and base region 32 which are not masked during this step. The additional P type impurities enhance the emitter injection efficiency thus improves the current gain in the lateral direction.

The counter doping step allows the use of an N− epitaxial layer as the region in which the PNP lateral transistor is formed. Thus, the process is compatible with the formation of other devices in other portions of the N epitaxial layer. Similarly, the counter doping allows individual tailoring of the collector resistance, and thus adjustment of the frequency response and the saturation voltage. Similarly, by the selection of the impurity concentration and depth of the ion implantation of the counter dope region 42, the grade of the impurity profile of the N+ base region 32 and epitaxial base portion 10 can be individually tailored to define the degree of enhancement of a transportation of carriers across the lateral base region so as to improve the frequency performance of the device. The counter doping step in the formation of counterdoped region 42 achieves the same sub-micron base width of the double-diffused lateral transistors of the prior art while allowing tailoring of the bulk resistance of this portion.

The process is completed by removing the thin oxide layer and forming metal contacts. These contacts are formed by the application of, for example, a metal layer and delineation of the metal layer to form the contacts and innerconnects.

Figure 8:
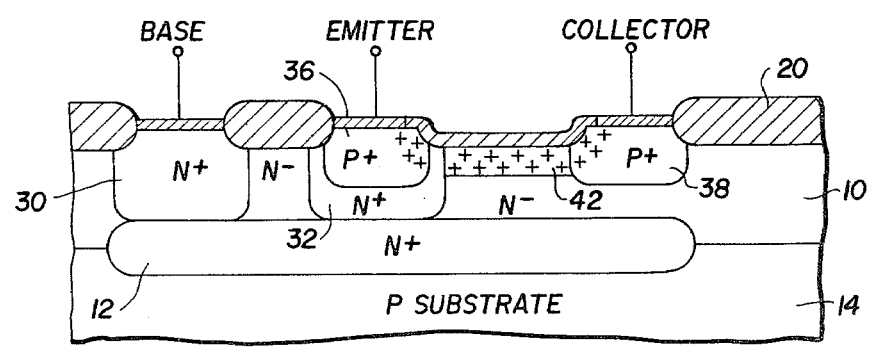
FIG. 8 is a cross-sectional view of another PNP lateral transistor incorporating the principles of the present invention.

As illustrated in FIG. 8, the process of the present invention may also be used for a lateral PNP transistor with a substantially reduced series base resistance. The above process is initially modified to form the buried N+ region 12 and limit the thickness of the epitaxial layer 10. During the subsequent processing steps to form base contact 30 and base region 32, the down diffusing base contact 30 and base region 32 mate with the up diffusing buried region 12 in the limited thickness epitaxial layer 10. This base structure will substantially eliminate the flow of base current through the N− epitaxial region 10 and thus reduce the series base resistance considerably.

It is evident from the description of the preferred embodiments, that the objects of the invention are attained in that a process is provided which results in an improved lateral PNP transistor. Although the invention has been described and illustrated in detail, it is to be clearly understood that the same is by way of illustration and example only and is not to be taken by way of limitation. The spirit and scope of this invention is to be limited only by the terms of the appended claims.

What is claimed:

1. A method of fabricating lateral PNP transistors comprising:
   introducing N type impurities into a low impurity concentration N type base region to form high impurity concentration N type base and base contact regions;
   introducing P type impurities into said low impurity concentration base region to form P type collector region and into said high impurity concentration base region to form P type emitter region; and
   introducing P type impurities into the region between said collector and emitter regions of sufficient concentration to counter dope the low impurity concentration base region between said collector region and said high impurity concentration base region without converting said high impurity concentration base region.

2. The method according to claim 1 wherein said P type impurities of the last mentioned step are introduced through a noncritical mask having an aperture over said base regions between said collector and emitter regions and portions of said collector and emitter regions.

3. The method according to claim 1 including forming a thick oxide layer on said low impurity concentration base region having base contact, emitter and collector region apertures in said thick layer, and subsequently introducing said impurities through said apertures.

4. The method according to claim 3 wherein said N type impurities are introduced through said base contact and emitter apertures, and said first mentioned P type impurities are introduced through said emitter and collector apertures.

5. The method according to claim 4 including removing portions of said thick oxide layer between said emitter and collector apertures between said first and second P type impurity introducing steps.

6. The method according to claim 3 wherein said apertures have thin oxide regions compared to said thick oxide layer and said impurities are introduced by ion implantation through said thin oxide regions with said thick oxide layer forming an implantation mask.

7. A method of fabricating lateral PNP transistors comprising:
   forming a mask layer on an N type with base contact, emitter and collector apertures in said mask layer;
   introducing N type impurities through said base contact and emitter apertures to form a base contact region and base region of higher impurity concentration than said layer;
   introducing P type impurities through said emitter and collector apertures to form an emitter region in said base region and collector region in said layer;
   removing portion of said mask layer between said emitter and collector apertures; and
   introducing P type impurties into the region between said emitter and collector regions of sufficient concentration to counter dope the portion of said layer between said collector region and said base region without converting said base region.

8. The method according to claim 7 wherein said impurities are introduced by ion implantation; and said collector aperture is masked during said N type impurity ion implantation and said base contact aperture is masked during the first P type impurity ion implantation.

9. The method according to claim 8 wherein the base contact, emitter and collector apertures are exposed during the second P type impurity ion implantation.

10. The method according to claim 9 wherein said apertures are masked by metal formed in said apertures.

11. The method according to claim 10 wherein forming said mask layer includes forming a thin oxide layer on said N type layer, forming oxidation inhibiting mask on said thin oxide layer to define said apertures and oxidizing said exposed thin oxide layer to form a thick oxide layer with thin oxide in said apertures.

* * * * *

UNITED STATES PATENT AND TRADEMARK OFFICE
CERTIFICATE OF CORRECTION

PATENT NO. : 4,283,236
DATED : August 11, 1981
INVENTOR(S) : Ramesh M. Sirsi

It is certified that error appears in the above—identified patent and that said Letters Patent is hereby corrected as shown below:

On the title page, in the abstract:
Line 2, delete "inpurities" and insert --impurities--

Signed and Sealed this

Seventh Day of December 1982

[SEAL]

Attest:

GERALD J. MOSSINGHOFF

*Attesting Officer*     *Commissioner of Patents and Trademarks*